(12) United States Patent
Corisis et al.

(10) Patent No.: US 6,381,141 B2
(45) Date of Patent: *Apr. 30, 2002

(54) INTEGRATED DEVICE AND METHOD FOR ROUTING A SIGNAL THROUGH THE DEVICE

(75) Inventors: David J. Corisis, Meridian; Fonda R. Victory, Emmett, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/173,538

(22) Filed: Oct. 15, 1998

(51) Int. Cl.$^7$ ............................. H05K 1/11; H01L 25/00
(52) U.S. Cl. ..................... 361/735; 361/733; 361/790; 361/803; 257/686; 257/723
(58) Field of Search ..................... 361/728, 729–735, 361/803, 782, 790, 763; 257/686, 723, 764

(56) References Cited

U.S. PATENT DOCUMENTS

| | | | |
|---|---|---|---|
| 5,656,856 A | 8/1997 | Kweon | 257/686 |
| 5,715,144 A * | 2/1998 | Ameen et al. | 361/790 |
| 5,723,901 A * | 3/1998 | Katsumata | 257/686 |
| 5,783,870 A * | 7/1998 | Mostafazadeh et al. | 257/791 |
| 5,963,430 A * | 10/1999 | Londa | 361/790 |
| 6,084,780 A * | 6/2000 | Happoya | 361/767 |

* cited by examiner

Primary Examiner—Jayprakash N. Gandhi
(74) Attorney, Agent, or Firm—Michael L. Lynch; Graybeal Jackson Haley LLP

(57) ABSTRACT

An integrated device includes a package having first and second sides, first package terminal disposed on the first side of the package, and a second package terminal disposed on the second side of the package in alignment with the first package terminal. An integrated circuit is mounted to the package and has an input terminal coupled to the first package terminal and an output terminal coupled to the second package terminal. In operation, the first package terminal receives a signal and couples the signal to the input terminal of the integrated circuit, the integrated circuit couples the signal from its input terminal to its output terminal, and the signal leaves the device via the second package terminal.

57 Claims, 8 Drawing Sheets

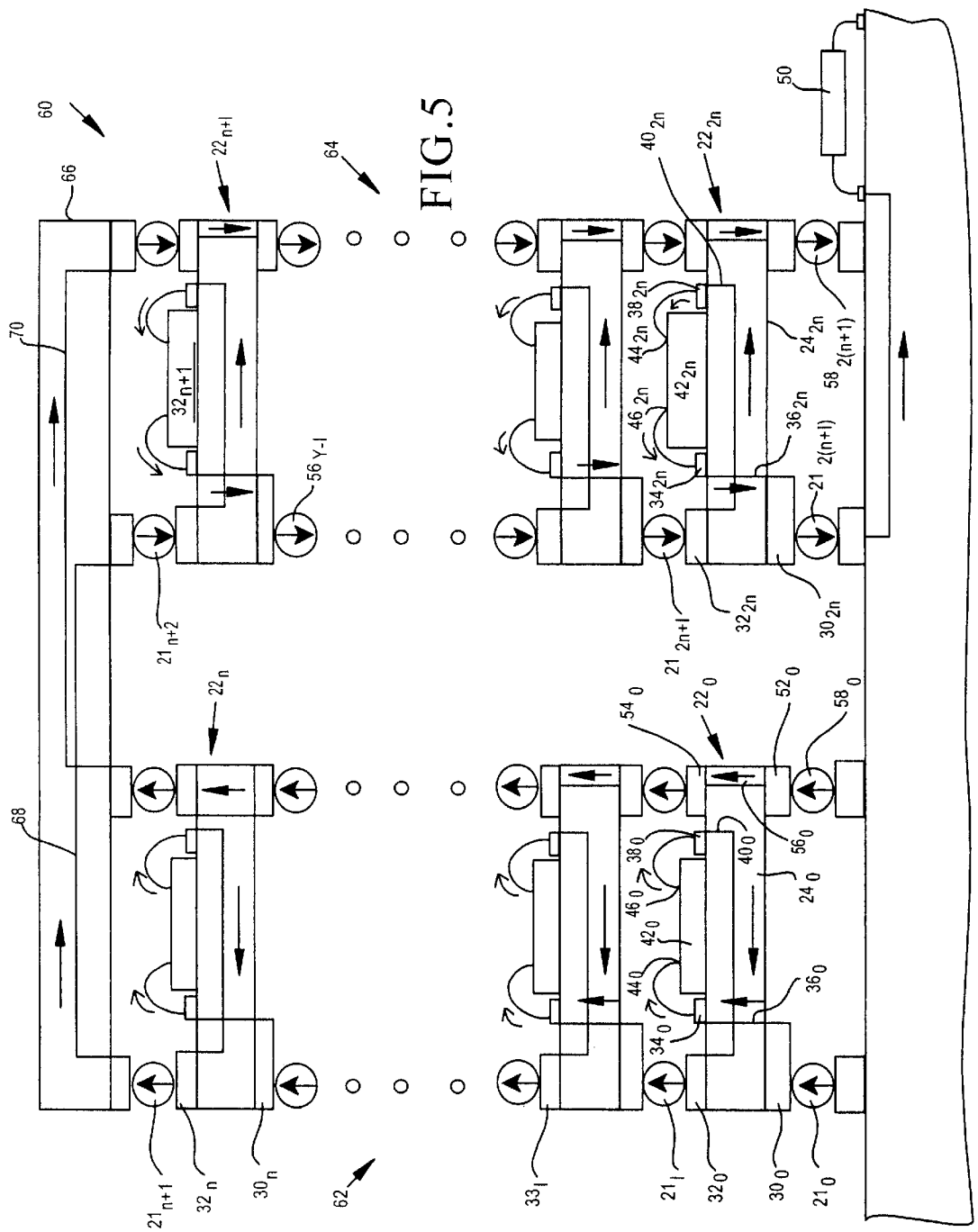

US 6,381,141 B2

1

INTEGRATED DEVICE AND METHOD FOR ROUTING A SIGNAL THROUGH THE DEVICE

TECHNICAL FIELD

The invention relates generally to electronic circuits, and more particularly to an integrated device that routes a signal through the device and to other devices in an integrated-circuit module.

BACKGROUND OF THE INVENTION

In today's marketplace, consumers are pressuring manufacturers of electronic products to squeeze more functionality into a smaller space. For example, consumers want smaller and lighter personal computers, such as laptops, that have faster, more powerful processors and greater memory capacity.

FIG. 1 is a side view of an integrated-circuit (IC) module 10, which allows manufactures to reduce the circuit-board area, and thus the overall size, of electronic products such as personal computers. The module 10 includes a number of integrated devices 12, which are stacked one atop the other, and is mounted to a circuit board 14. Therefore, no matter how many devices 12 it includes, the module 10 occupies the circuit-board area of only one device 12. This is a significant reduction in occupied area as compared to a scheme where the devices 12 are laid out side by side on the board 14.

More specifically, each of the devices 12 in the module 10 has a conventional package that allows coupling of signals between the board 14 and all of the devices 12. In the illustrated embodiment, the devices 12 each have a ball-grid-array (BGA) package, although other packages may be used as long as they allow stacking of the devices 12 to form the module 10. Each device 12 includes a number of connection balls 16, which are each coupled to a respective terminal 18. A respective conductor 19 couples each of the terminals 18 to a respective terminal 20 that is aligned with the terminal 18. For example, in the device $12_0$, the conductor $19_0$ couples the terminal $18_0$ to the terminal $20_0$. When the devices 12 are stacked to form the module 10, respective conductive paths are formed by the connection balls 16, the terminals 18 and 20, and the conductors 19. It is these conductive paths that couple respective signals between the circuit board 14 and all of the devices 12 in the module 10. For example, one such conductive path is formed by the ball $16_0$, terminal $18_0$, conductor $19_0$, terminal $20_0$, ball $16_1$, and so on up to the terminal $20_n$. Therefore, so that the module 10 works properly, all of the devices 12 have the same pin out, i.e., receive the same signals on the same respective terminals 18 and provide the same signals on the same respective terminals 20.

Unfortunately, referring to FIG. 2, which is a top view of one of the devices 12 of FIG. 1, the size of each device 12 is increased to accommodate signals that are not common to all of the devices 12. For example, each device 12 is enabled by a respective chip-select signal $CS_0$–$CS_n$, which is received on a respective chip-select terminal $18_{CS0}$–$18_{CSn}$. If they were laid out side by side on the board 14 (FIG. 1), then each of the devices 12 would need only one chip-select terminal $18_{CS}$. But because they are stacked, each device 12 has the same number of chip-select terminals $18_{CS0}$–$18_{CSn}$ as there are devices 12 in the module 10 (FIG. 1).

More specifically, for each unique signal such as a chip-select signal that they receive, the devices 12 each need n terminals, where n is the number of devices 12 in the module

2

10 (FIG. 1). Thus, just one or two unique signals may cause a significant increase in the sizes of the devices 12. For example, the device $12_0$ (FIG. 1) responds only to $CS_0$, and thus needs only the terminal $18_{CS0}$ to function properly. That is, the device $12_0$ has no need for $CS_1$–$CS_n$, and thus can function properly without the terminals $18_{CS1}$–$18_{CSn}$. But because the other devices $12_1$–$12_n$ in the module 10 respond to $CS_1$–$CS_n$, respectively, the device $12_0$ must also include the terminals $18_{CS1}$–$18_{CSn}$ to form conductive paths that couple $CS_1$–$CS_n$ to the devices $12_1$–$12_n$. For reasons including that the relative position of a device 12 in the module 10 is unknown during manufacture of the device 12, each of the devices $12_1$–$12_n$ also includes a respective set of terminals $18_{CS0}$–$18_{CSn}$.

BRIEF DESCRIPTION OF THE DRAWINGS

Following is a brief description of the drawing where like numerals are used to reference like elements.

FIG. 5 is a side view of another embodiment of an IC module according to the invention.

SUMMARY OF THE INVENTION

In one aspect of the invention, an integrated device includes a package having first and second sides, a first package terminal disposed on the first side of the package, and a second package terminal disposed on the second side of the package in alignment with the first package terminal. An integrated circuit is mounted to the package and has an input terminal coupled to the first package terminal and has an output terminal coupled to the second package terminal. In operation, the first package terminal receives a signal and couples the signal to the input terminal of the integrated circuit, the integrated circuit couples the signal from its input terminal to its output terminal, and the signal leaves the device via the second package terminal.

Such a device allows the coupling of multiple signals to multiple devices in an IC module over only one single path. For example, such a device may allow multiple devices in the module to share one chip-select signal path. Sharing the same signal path allows each device in the module to have only one terminal for a unique signal, and thus allows the devices and module to have smaller sizes than they might otherwise have.

DETAILED DESCRIPTION OF THE INVENTION

Figure 1:
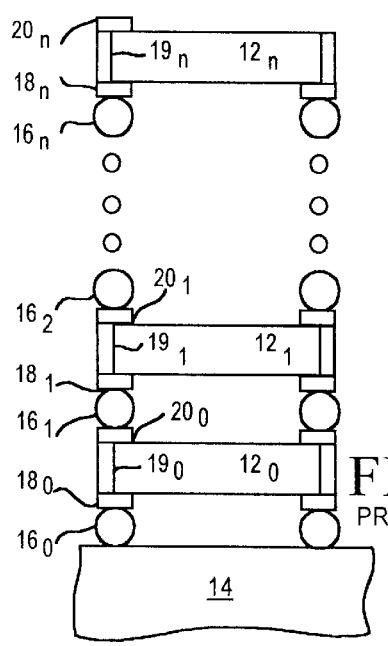
FIG. 1 is a side view of a known IC module.
Figure 2:
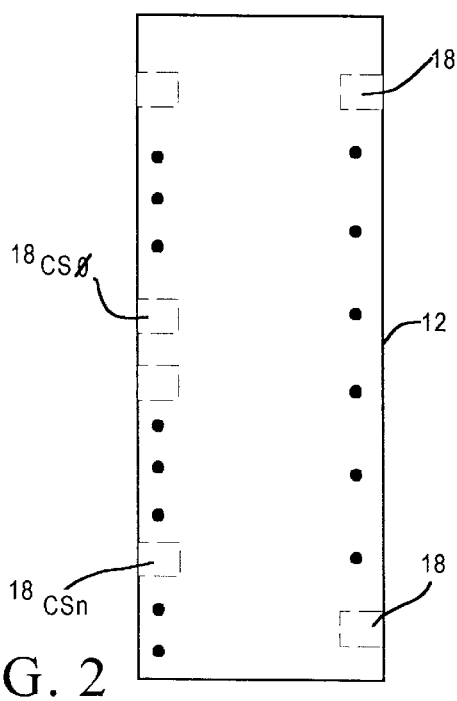
FIG. 2 is a top view of one of the devices that composes the IC module of FIG. 1.
Figure 3:
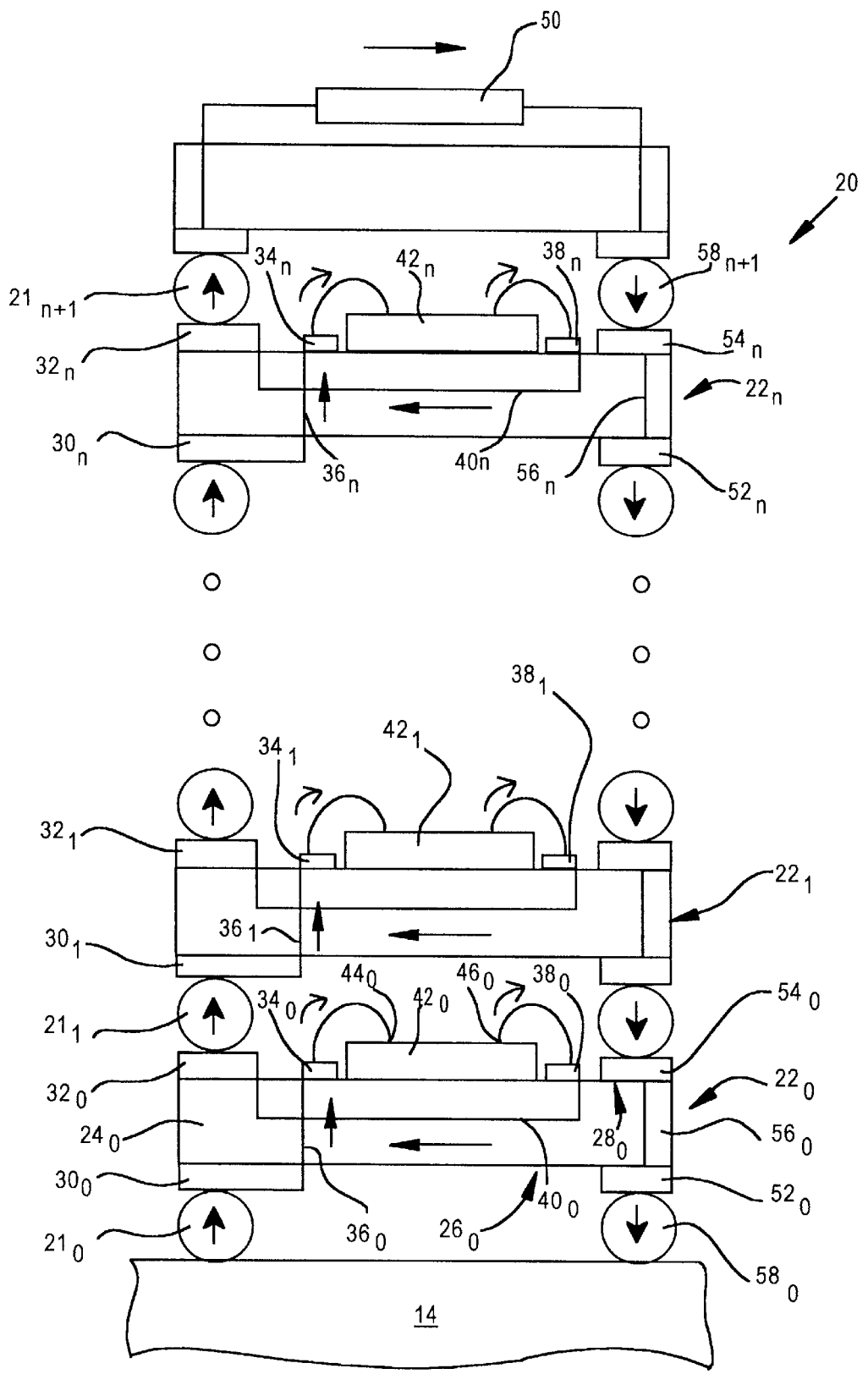
FIG. 3 is a side view of an embodiment of an IC module according to the invention.

FIG. 3 is a side view of an embodiment of an IC module 20 according to the invention. The module 20 is mounted to the circuit board 14 and includes one or more integrated devices $22_0$–$22_n$, which are coupled together by connecting balls 21 and which share the same signal path for signals, such as chip-select signals, that are respectively unique to each of the devices 22. Therefore, where the devices 22 are similar to the devices 12 of FIG. 1 except for the signal path sharing, each device 20 includes fewer terminals and occupies a smaller area than a device 12, and thus the module 20 occupies a smaller area than the module 10 of FIG. 1.

More specifically, each of the devices 22 of the module 20 includes a package 24 having a sides 26 and 28. Terminals 30 are disposed on the side 26, and terminals 32, which are each aligned with a respective terminal 30, are disposed on the side 28. For example, the terminals $30_0$ and $32_0$ of the device $22_0$ are aligned with one another. A conductive pad 34 is disposed on the side 28 and is coupled to the terminal 30 via a conductive path 36. Similarly, a pad 38 is disposed on the side 28 and is coupled to the terminal 32 via a conductive path 40. Although the path 40 is shown routed through the package 24, in other embodiments it is routed along the surface of the side 28. An integrated circuit 42, such as a memory circuit, is mounted to the package 24. In one embodiment, the circuit 42 is in die form. In another embodiment, the circuit 42 includes a Sync-Link Dynamic Random Access Memory (SLDRAM) that operates at clock speeds up to 800 MHZ. In still another embodiment, the package 24 encapsulates the circuit 42 to protect it from the environment. In yet another embodiment, the package includes a substrate, such as a circuit board, to which the circuit 42 is mounted. The circuit 42 has an input terminal 44, which is coupled to the pad 34, and has an output terminal 46, which is coupled to the pad 38. In the illustrated embodiment, the terminals 44 and 46 are wire bonded to the pads 34 and 38, respectively, although other coupling techniques may be used.

During operation of the module 20, the integrated circuit $42_0$ of the device $22_0$ receives a signal from the circuit board 14 via the connection ball $21_0$, terminal $30_0$, path $36_0$, pad $34_0$, and input terminal $44_0$, and provides the signal to the connection ball $21_1$ via the output terminal $46_0$, pad $38_0$, path $40_0$, and terminal $32_0$. The other devices $22_1$–$22_{n-1}$ operate in a similar manner such that the signal is serially coupled all the way to the device $22_n$. Arrows in FIG. 3 show the direction of the signal flow along this serial path.

Each of the devices 22 may, however, respond only to a respective one of the signals, even though all of the signals are coupled through the same serial path. For example, if the signals transmitted along this path are chip-select signals, then each of the integrated circuits 42 may be constructed or programmed to recognize a unique voltage drop across its terminals 44 and 46. That is, a circuit 42 will not be enabled until the appropriate chip-select voltage is applied to the signal path. Thus, by providing chip-select signals of differing voltage levels, the desired one of the devices 22 can be selected. Alternatively, the chip-select signals may be digital, and each circuit 44 programmed to recognize a unique digital value. Furthermore, signals other than chip-select signals may be routed according to these techniques.

Still referring to FIG. 3, in high-frequency applications, it may be desirable to terminate the serial path at its end to prevent undesirable transmission-line effects. Therefore, the module 20 may include a termination circuit, such as a termination impedance 50, which is coupled between the end of the signal path, here the connection ball $21_{n+1}$, and ground or another termination node. The impedance 50 may include e.g., a resistor, capacitor, or transmission-line stub. In one embodiment, a conductive path to the board 14 is formed by terminals 52 and 54, conductors 56, and connection balls 58, and the termination impedance 50 is coupled between the connection balls $21_{n+1}$ and $58_{n+1}$. If this conductive path is required whether or not the impedance 50 is present (for example, if it is a ground path), then the addition of the impedance 50 does not require the devices 22 to have additional terminals. Alternatively, if this path is a dedicated termination path, then the connection balls $21_{n+1}$ and $58_{n+1}$ can be shorted together so that the termination impedance 50 can be located on the circuit board 14.

Although the module 20 is shown having BGA connections between the devices 22, other types of connections may be used. Furthermore, although the input and output terminals 44 and 46 are shown on opposite sides of the respective integrated circuits 42, they may have different locations. Additionally, the input terminals 44 may be wire bonded directly to the respective terminals 30, and the output terminals 46 may be wire bonded directly to the respective terminals 32, thus eliminating the need for the pads 34 and 38 and the conductive paths 36 and 40.

Figure 4:
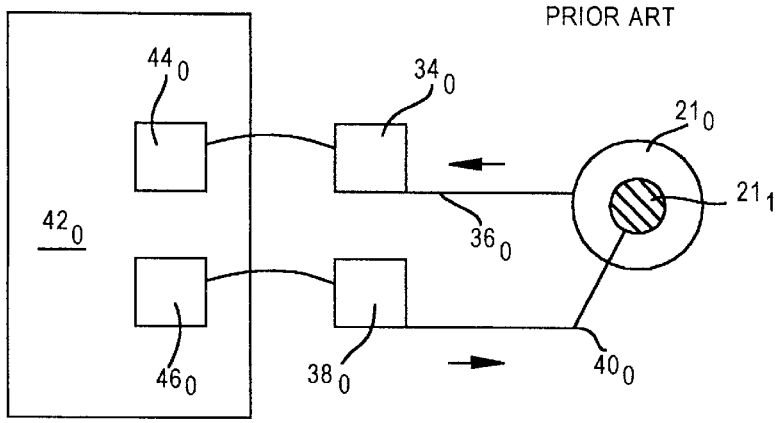
FIG. 4 is a coupling diagram for the devices that compose the IC module of FIG. 3.

FIG. 4 is a top view of one embodiment of the device $22_0$ and the coupling between the circuit $42_0$ and the terminals $44_0$ and $46_0$. In this embodiment, the terminals $44_0$ and $46_0$ are arranged side by side, and the terminals $30_0$ and $32_0$ are omitted for clarity. As in FIG. 3, the arrows show the direction of signal flow. The conductive paths $36_0$ and $40_0$ can be formed from any combination of conductive traces on and vias between the package surfaces $26_0$ and $28_0$ (FIG. 3). The other devices 22 can have a similar coupling scheme.

FIG. 5 is a side view of an IC module 60 according to another embodiment of the invention. The module 60 includes two stacks 62 and 64 of the devices 22, and is useful in high-frequency applications. Because of its larger surface area, the module 60 often allows greater heat-dissipation than the module 20 of FIG. 3. Also, the module 60 may provide shorter signal paths including shorter serial paths that are terminated at their respective ends.

The stack 62 of the module 60 is similar to the single stack of the devices 22 in the module 20 of FIG. 3. Thus, the serial signal path of the stack 62 begins at the ball $21_0$ and ends at the ball $21_{n+1}$. The module 60 also includes a shunt coupler 66 having a conductor 68 for coupling the ball $21_{n+1}$ to the ball $21_{n+2}$, which is the input ball of the stack 64.

The stack 64 is similar to the stack 62, except that the signal flow along the serial path is in the opposite direction, i.e., top to bottom instead of bottom to top. To accommodate this reversed signal flow, the connections to the integrated circuits 42 are reversed. For example, in the device $22_{2n}$, the input terminal $44_{2n}$ is coupled to the pad $38_{2n}$ instead of the pad $34_{2n}$. Likewise, the output terminal $46_{2n}$ is coupled to the pad $34_{2n}$ instead of the pad $38_{2n}$. Thus, the integrated circuit $42_{2n}$ receives the signal from the ball $21_{2n+1}$ via the terminal $32_{2n}$, path $40_{2n}$, pad $38_{2n}$, and input terminal $44_{2n}$, and provides the signal to the connection ball $21_{2(n+1)}$ via the output terminal $46_{2n}$, pad $34_{2n}$, path $36_{2n}$, and terminal $30_{2n}$. The other devices $22_{n+1}$–$22_{2n-1}$ of the stack 64 are similarly constructed such that the stack 64 receives the signal from the stack 62 and couples the signal back to the board 14 for termination by a termination circuit such as the termination impedance 50. Again, the arrows show the direction of the signal flow along the serial path. It is clear that for the same number n of devices 22 in the modules 20 and 60, the heights of the stacks 62 and 64 are approximately half the height of the single stack in the module 20. Therefore, for the same number n of devices 22, the terminated serial path of the module 60 is approximately one half the length of the terminated serial path of the module 20 of FIG. 3.

The module 60 also includes a path for a signal, such as an address signal, that the devices 22 of both stacks 62 and 64 receive in parallel. As shown by the arrows, the path begins with the ball $58_0$, extends through the first stack 62, a conductor 70 of the coupler 66, the stack 64, and to the ball $58_{2(n+1)}$, and thus can be terminated on the board 14.

In one embodiment, whether the signals are serially routed like the chip-select signals or parallel routed like an address signal, they are routed up from the board 14 via the left and right sides of the stack 62 and back down to the circuit board 14 via the left and right sides of the stack 64, respectively.

Figure 6:
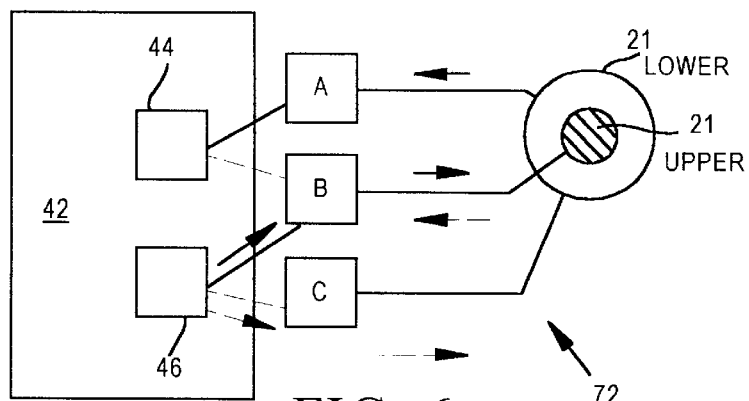
FIG. 6 is a coupling diagram for the devices that compose the IC module of FIG. 5.

FIG. 6 is a top view of one embodiment of a device 22 of the module 60 of FIG. 5 and the coupling options between the circuit 42 and the balls 21. The package 24 includes a routing scheme 72 having two connection options, a first one for the devices 22 of the stack 62 (shown in solid line and with solid arrows) and a second one for the devices 22 of the stack 64 (shown in broken line with broken arrows). Having this connection scheme allows the same packages 24 to be used for the devices 22 in both of the stacks 62 and 64. More specifically, in the first option, the pads A and B correspond to the pads 34 and 38, respectively, of the devices 22 in the stack 62. Thus, as shown by the solid arrows, the signal flow is from the lower ball 21 (for example, $21_0$) into the input terminal 44 via the pad A, and out of the output terminal 46 to the upper ball 21 (for example, $21_1$) via the pad B. In the second option, the pads B and C correspond to the pads 38 and 34, respectively, of the devices 22 in the stack 64. Thus, as shown by the broken arrows, the signal flow is from the upper ball 21 (for example, $21_1$) into the input terminal 44 via the pad B, and out of the output terminal 46 to the lower ball 21 (for example, 210) via the pad C.

Figure 7:
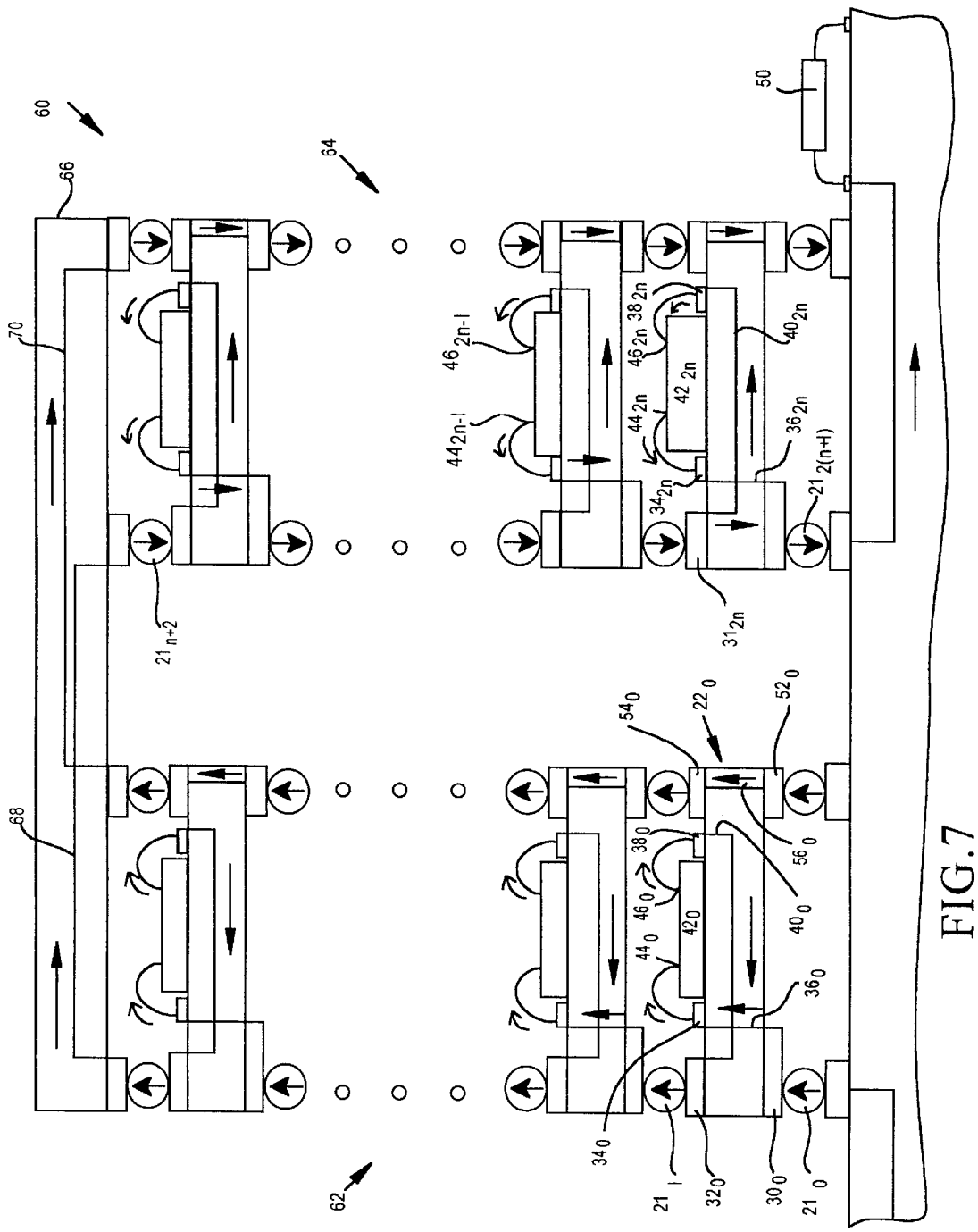
FIG. 7 is a side view of another embodiment of the IC module of FIG. 5.

FIG. 7 is a side view of another embodiment of the IC module 60 according to the invention. Here, identical devices 22 are used in both of the stacks 62 and 64. Thus, unlike the embodiment of FIG. 5, only one version of the devices 22 need be manufactured and tested. This is advantageous because it is often easier and less expensive to manufacture and test one version of a part than it is to manufacture and test multiple versions. To allow the use of identical devices 22 in both stacks 62 and 64, the integrated circuits 42 are conventionally designed to recognize which of the terminals 44 and 46 is being used as an input terminal and which is being used as an output terminal, and to then configure these terminals appropriately. For example, in one embodiment, the integrated circuit $42_0$ measures the voltage drop across the terminals $44_0$ and $46_0$ and configures the terminal at the higher voltage as the input terminal and configures the terminal at the lower voltage as the output terminal. The other circuits 42 operate in a similar manner. Thus, because the connections of the terminals 44 and 46 in the stack 64 are not reversed with respect to the connections of the terminals 44 and 46 in the stack 62 as in the embodiment of FIG. 5, only one version of the devices 22 needs to be manufactured and tested.

Figure 8:
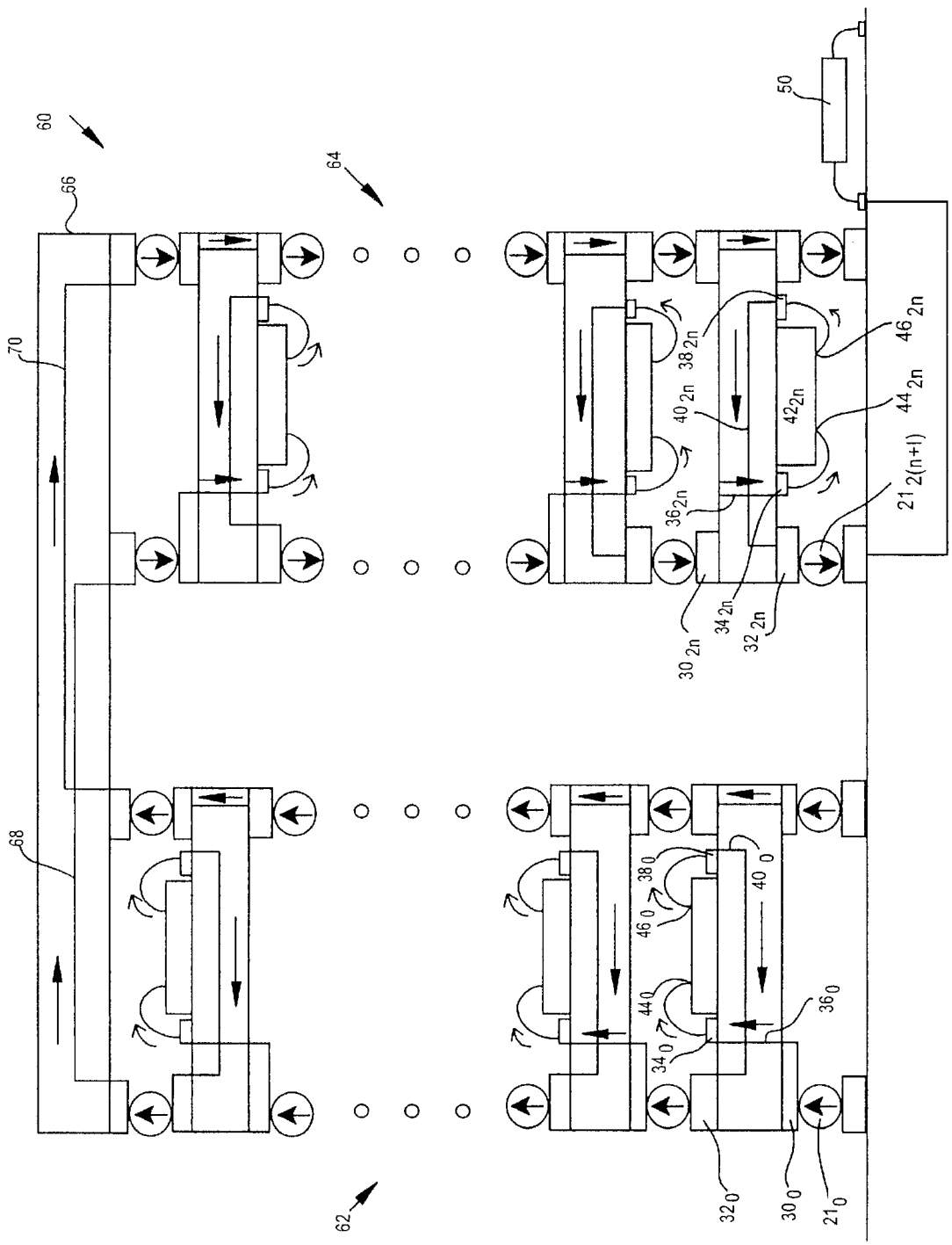
FIG. 8 is a side view of another embodiment of the IC module of FIG. 5.

FIG. 8 is a side view of another embodiment of the IC module 60 of FIG. 5. In this embodiment, not only can both of the stacks 62 and 64 use identical devices 22, but unlike the embodiment of FIG. 7, the integrated circuits 42 need not dynamically configure the terminals 44 and 46. Therefore, the integrated circuits 42 used in this embodiment can be less complex and smaller because they do not need the dynamic configuration circuitry like the circuits 42 in the FIG. 7 embodiment. More specifically, the stack 62 in this embodiment is similar to the stacks 62 of FIGS. 5 and 7. In the stack 64, however, the devices 22 are flipped such that they are upside down with respect to the devices 22 in the stack 62. Therefore, a signal routed along the serial path enters a device 22 in the stack 64 via the terminal 30 and exits the device via the terminal 32 just as it enters and exits a device 22 in the stack 62.

Figure 9:
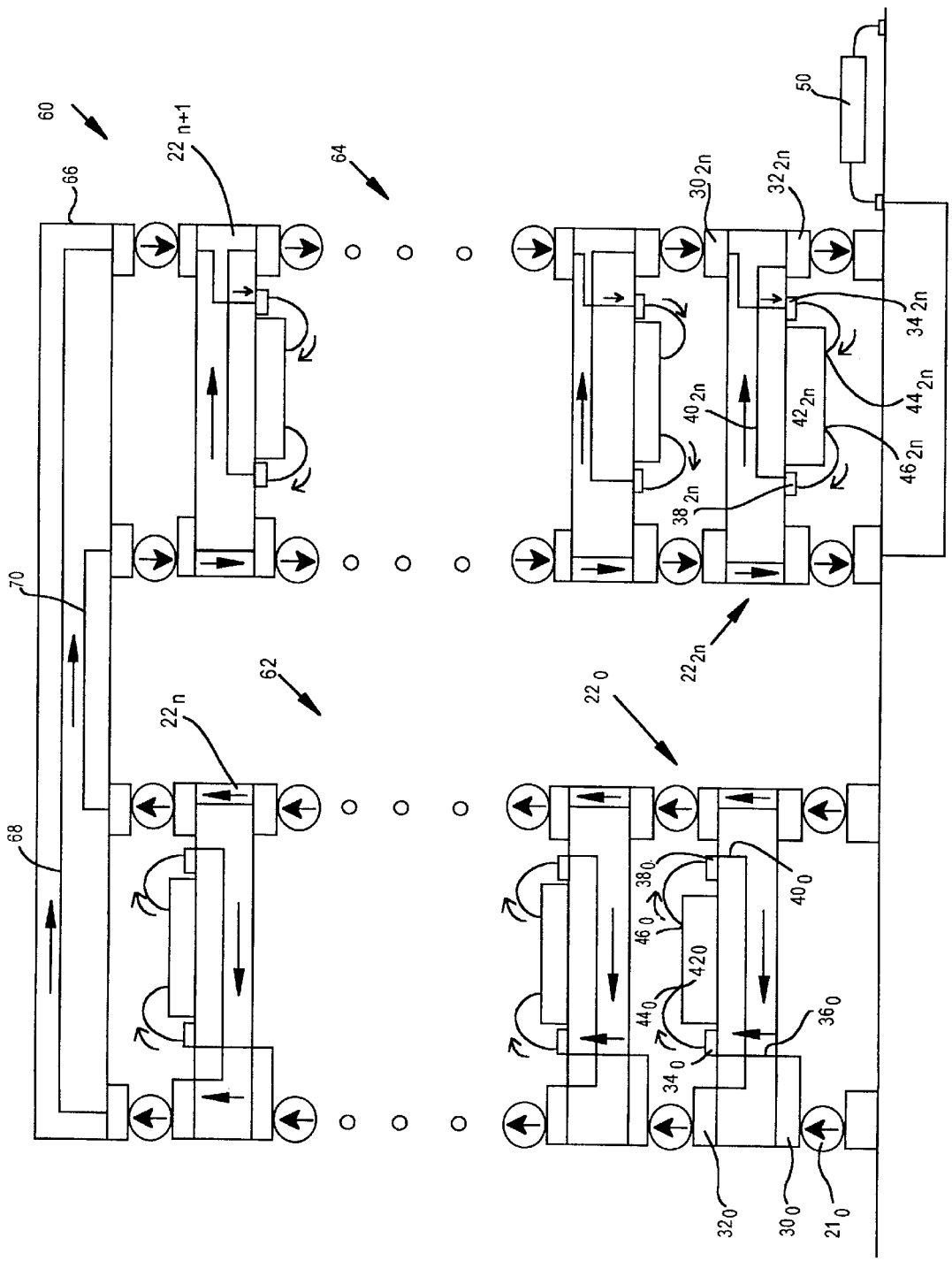
FIG. 9 is a side view of another embodiment of the IC module of FIG. 5.

FIG. 9 is a side view of yet another embodiment of the IC module 60 in which some signal paths between the stacks 62 and 64 are significantly shortened. Such shorter paths may be desirable for routing high-frequency signals to minimize transmission line effects.

More specifically, the module 60 of FIG. 9 is similar to the module 60 of FIG. 8, except that in the FIG. 9 embodiment, the stack 64 is oriented as if its left side were "hinged" to the right side of the stack 62. Therefore, all of the signals that are routed along the right side of the stack 62 are also routed along the left side of the stack 64, and all of the signals routed along the left side of the stack 62 are also routed along the right side of the stack 64. Because the right side of the stack 62 and the left side of the stack 64 are adjacent, the distance between them is much less than for the right-side-to-right-side and left-side-to-left-side routing of the modules 60 in FIGS. 5, 7, and 8. Although it is true that now the signal paths along the left side of the stack 62 and right side of the stack 64 are longer than the signal paths in FIGS. 5, 7, and 8, the devices 22 can be designed so that lower frequency signals are routed along these paths so that the additional distance does not cause undesirable transmission line effects. Thus, besides the different orientations of the devices 22 in the stack 64, the only major structural difference between the modules 60 of FIGS. 8 and 9 is that in the FIG. 9 embodiment, the coupler 66 couples the terminals on the left side of the stack 62 to the respective terminals on the right side of the stack 54, and couples the terminals on the right side of the stack 62 to those on the left side of the stack 64.

Figure 10:
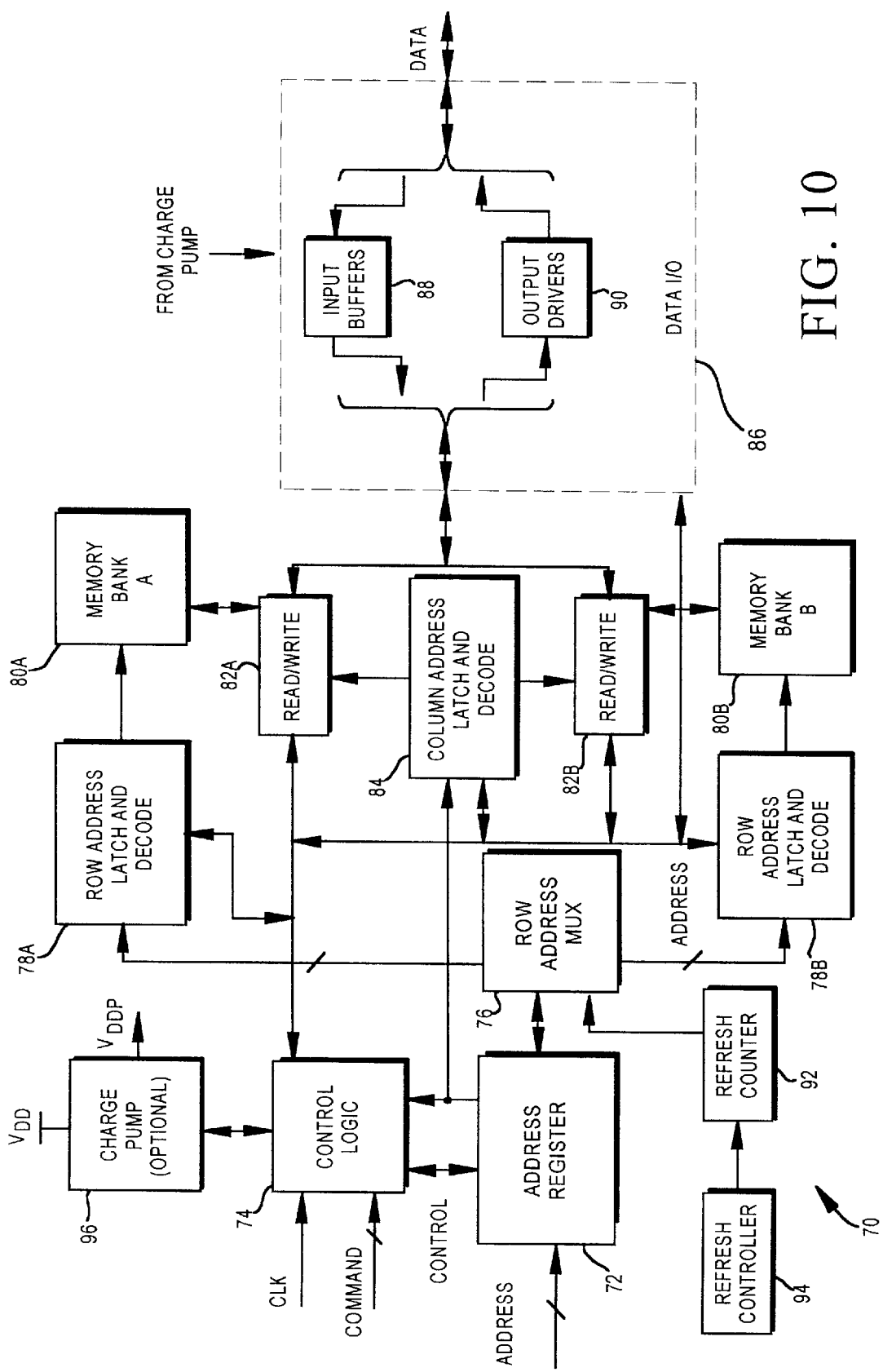
FIG. 10 is a schematic block diagram of a memory circuit that can be incorporated into one or more of the devices that compose the IC modules of FIGS. 3, 5, 7, 8, and 9.

FIG. 10 is a block diagram of a memory circuit 70, which can compose one or more of the integrated circuits 42 of FIGS. 3–9.

The memory circuit 70 includes an address register 72, which receives an address from an ADDRESS bus. A control logic circuit 74 receives a clock (CLK) signal, and receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory circuit 70. A row address multiplexer 76 receives the address signal from the address register 72 and provides the row address to the row-address latch-and-decode circuits 78a and 78b for the memory bank 80a or 80b, respectively. During read and write cycles, the row-address latch-and-decode circuits 78a and 78b activate the work lines of the addressed rows of memory cells in the memory banks 80a and 80b, respectively. Read/write circuits 82a and 82b read data from the addressed memory cells in the memory banks 80a and 80b, respectively, during a read cycle, and write data to the addressed memory cells during a write cycle. A column-address latch-and-decode circuit 84 receives the address from the address register 72 and provides the column address of the selected memory cells to the read/write circuits 82a and 82b. For clarity, the address register 72, the row-address multiplexer 76, and row-address latch-and-decode circuits 78*a* and 78*b*, and the column-address latch-and-decode circuit 84 can be collectively referred to as an address decoder.

A data input/output (I/O) circuit 86 includes a plurality of input buffers 88. During a write cycle, the buffers 88 receive and store data from the DATA bus, and the read/write circuits 82*a* and 82*b* provide the stored data to the memory banks 80*a* and 80*b*, respectively. The data I/O circuit 86 also includes a plurality of output drivers 90. During a read cycle, the read/write circuits 82*a* and 82*b* provide data from the memory banks 80*a* and 80*b*, respectively, to the drivers 90, which in turn provide this data to the DATA bus.

A refresh counter 92 stores the address of the row of memory cells to be refreshed either during a conventional auto-refresh mode or self-refresh mode. After the row is refreshed, a refresh controller 94 updates the address in the refresh counter 92, typically by either incrementing or decrementing the contents of the refresh counter 92 by one. Although shown separately, the refresh controller 94 may be part of the control logic 74 in other embodiments of the memory circuit 70.

The memory device 70 may also include an optional charge pump 96, which steps up the power-supply voltage $V_{DD}$ to a voltage $V_{DDP}$. In one embodiment, the pump 96 generates $V_{DDP}$ approximately 1–1.5 V higher than VDD. The memory circuit 70 may also use $V_{DDP}$ to conventionally overdrive selected internal transistors.

Figure 11:
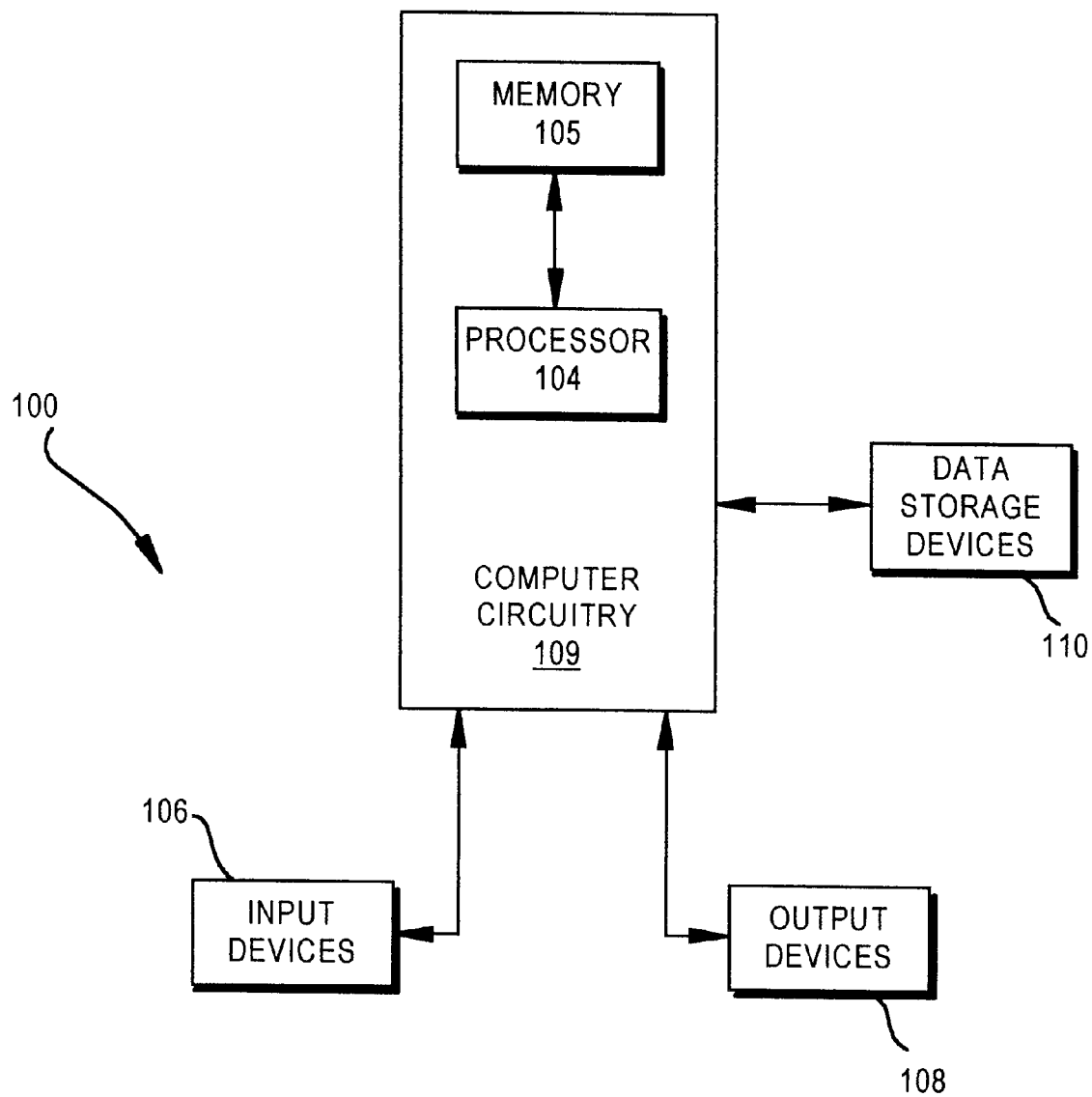
FIG. 11 is a block diagram of an electronic computer system that can incorporate one or more of the IC modules of FIGS. 3, 5, 7, 8, and 9.

FIG. 11 is a block diagram of an electronic system 100, such as a computer system, the can incorporate one or more of the modules 20 of FIG. 3 or the modules 60 of FIGS. 5, 7, 8, and 9. The system 100 includes computer circuitry 102 for performing computer functions, such as executing software to perform desired calculations and tasks. The circuitry 102 typically includes a processor 104 and a memory section 105, which may include one or more of the memory circuits 70. The memory section 105 is coupled to the processor 104. One or more input devices 106, such as a keyboard or a mouse, are coupled to the computer circuitry 102 and allow an operator (not shown) to manually input data thereto. One or more output devices 168 are coupled to the computer circuitry 102. Examples of such output devices 108 include a printer and a video display unit. One or more data-storage devices 110 are coupled to the computer circuitry 102 to store data on or retrieve data from external storage media (not shown). Examples of the storage devices 110 and the corresponding storage media include drives that accept hard and floppy disks, tape cassettes, and compact disk read-only memories (CD-ROMs). Typically, the computer circuitry 102 includes address data and command buses and a clock line that are respectively coupled to the ADDRESS, DATA, and COMMAND buses, and the CLK line of the memory circuit 70. The computer circuitry 102, processor 104, input devices 106, output devices 108, and storage devices 170 may each include one or more of the modules 20 of FIG. 3 or the modules 60 of FIGS. 5, 7, 8, and 9.

From the foregoing it will be appreciated that, although specific embodiments of the invention have been described herein for purposes of illustration, various modifications may be made without deviating from the spirit and scope of the invention.

What is claimed:

1. An integrated device, comprising:

a package having first and second sides;

a first package terminal disposed on the first side of the package and operable to receive a signal;

a second package terminal disposed on the second side of the package in alignment with the first package terminal; and an integrated circuit mounted to the package and having a circuit input terminal electrically coupled to the first package terminal and having a circuit output terminal electrically coupled to the second package terminal, the integrated circuit operable to electrically couple the signal from the circuit input terminal, through the integrated circuit, to the circuit output terminal.

2. The device of claim 1 wherein the first and second package terminals comprise respective conductive balls.

3. The device of claim 1 wherein the integrated circuit is disposed within the package.

4. The device of claim 1 wherein the package comprises a substrate having a first conductive path operable to couple the signal from the first package terminal to the circuit input terminal and having a second conductive path operable to couple the signal from the circuit output terminal to the second package terminal.

5. The device of claim 1 wherein the package comprises a substrate having a first conductive path operable to couple the signal from the first package terminal to the circuit input terminal and having a second conductive path operable to couple the signal from the circuit output terminal to the second package terminal; and wherein the integrated circuit is mounted to the substrate.

6. An integrated device, comprising:

a package having first and second sides;

a first package terminal disposed on the first side of the package;

a second package terminal disposed on the second side of the package in alignment with the first package terminal; and an integrated circuit mounted to the package and having a first circuit terminal electrically coupled to the first package terminal, a second circuit terminal electrically coupled to the second package terminal, and a first conductive path that electrically couples the first circuit terminal to the second circuit terminal.

7. The device of claim 6 wherein the package comprises a substrate having a first conductive path that electrically couples the first package terminal to the first circuit terminal and having a second conductive path that electrically couples the second package terminal to the second circuit terminal.

8. The device of claim 6 wherein the package comprises a printed circuit board having a first conductive trace electrically connecting the first package terminal to the first circuit terminal and having a second conductive trace electrically connecting the second package terminal to the second circuit terminal.

9. The device of claim 6 wherein the package comprises a layer that encapsulates the integrated circuit.

10. The device of claim 6, further comprising:

a third package terminal disposed on the second side of the package and electrically coupled to the second package terminal; and a fourth package terminal disposed on the first side of the package and electrically coupled to the third package terminal.

11. The device of claim 6, further comprising:

a third package terminal disposed on the second side of the package and electrically coupled to the second package terminal; and a fourth package terminal disposed on the first side of the package and aligned with and electrically coupled to the third package terminal.

12. The device of claim 6, further comprising:
a third package terminal disposed on the second side of the package;
a coupler disposed on the package and having a conductive path electrically coupled between the second and third package terminals; and
a fourth package terminal disposed on the first side of the package and electrically coupled to the third package terminal.

13. The device of claim 6, further comprising:
a third package terminal disposed on the second side of the package;
a termination circuit disposed on the package and electrically coupled between the second and third package terminals; and
a fourth package terminal disposed on the first side of the package and electrically coupled to the third package terminal.

14. An integrated-circuit module, comprising:
a first integrated device including:
  a first package having first and second sides;
  a first package terminal disposed on the first side and operable to receive a signal;
  a second package terminal disposed on the second side and aligned with the first package terminal; and
  a first integrated circuit mounted to the first package and having a first circuit input terminal electrically coupled to the first package terminal and having a first circuit output terminal electrically coupled to the second package terminal, the integrated circuit operable to couple the signal from the first circuit input terminal, through the integrated circuit, to the first circuit output terminal; and
a second integrated device including:
  a second package having first and second sides;
  a first package terminal disposed on the first side of the second package and electrically coupled to and operable to receive the signal from the second package terminal of the first device;
  a second package terminal disposed on the second side of and aligned with the first package terminal of the second device; and
  a second integrated circuit mounted to the second package and having a second circuit input terminal electrically coupled to the first package terminal of the second device and having a second circuit output terminal electrically coupled to the second package terminal of the second device, the second integrated circuit operable to couple the signal from the second circuit input terminal, through the second integrated circuit, to the second circuit output terminal.

15. The integrated-circuit module of claim 14 wherein:
the first package comprises a first substrate having a first conductive path operable to couple the signal from the first package terminal of the first device to the first circuit input terminal of the first integrated circuit and having a second conductive path operable to couple the signal from the first circuit output terminal of the first integrated circuit to the second package terminal of the first device; and
the second package comprises a second substrate having a first conductive path operable to couple the signal from the first package terminal of the second device to the second circuit input terminal of the second integrated circuit and having a second conductive path operable to couple the signal from the second circuit output terminal of the second integrated circuit to the second package terminal of the second device.

16. The integrated-circuit module of claim 14 wherein the first device includes third and fourth package terminals respectively disposed on the first and second sides of the first package, the fourth package terminal coupled to the second package terminal of the second device and to the third package terminal, the fourth package terminal operable to receive the signal from the second package terminal of the second device and to couple the signal to the third package terminal.

17. The integrated-circuit module of claim 14 wherein:
the second device includes a third package terminal disposed on the first side of the second package, the third package terminal coupled to and operable to receive the signal from the second package terminal of the second device; and
the first device includes third and fourth package terminals respectively disposed on the first and second sides of the first package, the fourth package terminal coupled to the third package terminals of the first and second devices, the fourth package terminal operable to receive the signal from the third package terminal of the second device and to couple the signal to the third package terminal of the first device.

18. The integrated-circuit module of claim 14 wherein:
the second device includes a third package terminal disposed on the first side of the second package, the third package terminal coupled to and operable to receive the signal from the second package terminal of the second device; and
the first device includes third and fourth package terminals respectively disposed on the first and second sides of the first package and aligned with one another, the fourth package terminal coupled to the third package terminals of the first and second devices, the fourth package terminal operable to receive the signal from the third package terminal of the second device and to couple the signal to the third package terminal of the first device.

19. The integrated-circuit module of claim 14 wherein:
the second device includes third and fourth inter-coupled package terminals respectively disposed on the first and second sides of the second package, the fourth package terminal coupled to and operable to receive the signal from the second package terminal of the second device; and
the first device includes third and fourth package terminals respectively disposed on the first and second sides of the first package and aligned with one another, the fourth package terminal of the first device coupled to the third package terminals of the first and second devices, the fourth package terminal of the first device operable to receive the signal from the third package terminal of the second device and to couple the signal to the third package terminal of the first device.

20. The integrated-circuit module of claim 14 wherein:
the second device includes third and fourth inter-coupled package terminals respectively disposed on the first and second sides of the second package and aligned with one another, the fourth package terminal coupled to and operable to receive the signal from the second package terminal of the second device; and
the first device includes third and fourth package terminals respectively disposed on the first and second sides of the first package and aligned with one another, the fourth package terminal of the first device coupled to the third package terminals of the first and second devices, the fourth package terminal of the first device operable to receive the signal from the third package terminal of the second device and to couple the signal to the third package terminal of the first device.

21. The integrated-circuit module of claim 14, further comprising:
a termination circuit coupled to and operable to receive the signal from the second package terminal of the second device;
wherein the first device includes third and fourth package terminals respectively disposed on the first and second sides of the first package, the fourth package terminal coupled to the termination circuit and to the third package terminal, the fourth package terminal operable to receive the signal from the termination circuit and to couple the signal to the third package terminal.

22. The integrated-circuit module of claim 14 wherein the second device is disposed on the first device.

23. The integrated-circuit module of claim 14 wherein the second device is disposed adjacent to the first device.

24. An integrated-circuit module, comprising:
a first integrated device including:
a first package having first and second sides;
a first package terminal disposed on the first side;
a second package terminal disposed on the second side and aligned with the first package terminal; and
a first integrated circuit mounted to the first package and having a first circuit input terminal electrically coupled to the first package terminal, a first circuit output terminal electrically coupled to the second package terminal, and a first conductive path electrically coupled to the first circuit input and output terminals; and
a second integrated device including:
a second package having first and second sides;
a first package terminal disposed on the first side of the second package and electrically coupled to the second package terminal of the first device;
a second package terminal disposed on the second side of and aligned with the first package terminal of the second package; and
a second integrated circuit mounted to the second package and having a second circuit input terminal electrically coupled to the first package terminal of the first device, a second circuit output terminal electrically coupled to the second package terminal of the second device, and a second conductive path electrically coupled to the second circuit input and output terminals.

25. The integrated-circuit module of claim 24 wherein:
the first package comprises a first substrate having a third conductive path coupled to the first package terminal of the first device and to the first circuit input terminal of the first integrated circuit and having a fourth conductive path coupled to the first circuit output terminal of the first integrated circuit and to the second package terminal of the first device; and
the second package comprises a second substrate having a fifth conductive path coupled to the first package terminal of the second device and to the second circuit input terminal of the second integrated circuit and having a sixth conductive path coupled to the second circuit output terminal of the second integrated circuit and to the second package terminal of the second device.

26. The integrated-circuit module of claim 24 wherein the first device includes third and fourth package terminals respectively disposed on the first and second sides of the first package, the fourth package terminal coupled to the second package terminal of the second device and to the third package terminal.

27. The integrated-circuit module of claim 24, further comprising:
a termination circuit coupled to the second package terminal of the second device; and
wherein the first device includes third and fourth package terminals respectively disposed on the first and second sides of the first package, the fourth package terminal coupled to the termination circuit and to the third package terminal.

28. The integrated-circuit module of claim 24 wherein the second device is disposed on the first device.

29. The integrated-circuit module of claim 24 wherein the second device is disposed adjacent to the first device.

30. An integrated-circuit module, comprising:
a first integrated device including:
a first package having first and second opposite sides;
a first package terminal disposed on the first side and operable to receive a signal;
a second package terminal disposed on the second side and aligned with the first package terminal; and
a first integrated circuit mounted to the first package and having a first circuit input terminal electrically coupled to the first package terminal and having a first circuit output terminal electrically coupled to the second package terminal, the integrated circuit operable to couple the signal from the first circuit input terminal to the first circuit output terminal;
a coupler having a first coupler terminal electrically coupled to the second package terminal and having a second coupler terminal, the coupler operable to couple the signal from the first coupler terminal to the second coupler terminal; and
a second integrated device disposed adjacent to the first packaged device and including:
a second package having first and second opposite sides;
a first package terminal disposed on the first side of the second package and operable to receive the signal from the second coupler terminal;
a second package terminal disposed on the second side of the second package and aligned with the first package terminal of the second device; and
a second integrated circuit mounted to the second package and having a second circuit input terminal electrically coupled to the first package terminal of the first device and having a second circuit output terminal electrically coupled to the second package terminal of the second device, the second integrated circuit operable to couple the signal from the second circuit input terminal to the second circuit output terminal.

31. The integrated-circuit module of claim 30 wherein:
the first integrated circuit is mounted to the second side of the first package; and
the second integrated circuit is mounted to the first side of the second package.

32. The integrated-circuit module of claim 30 wherein:
the first integrated circuit is mounted to the second side of the first package; and
the second integrated circuit is mounted to the second side of the second package.

33. The integrated-circuit module of claim 30 wherein:
the first package has first and second opposite edges that extend between the first and second sides;
the second package terminal of the first device is disposed along the first edge of the first package;
the second package has first and second opposite edges that extend between the first and second sides;
the first package terminal of the second device is disposed along the first edge of the second package; and
the second edge of the first package is adjacent to the first edge of the second package.

34. The integrated-circuit module of claim 30 wherein:
the first package has first and second opposite edges that extend between the first and second sides;
the second package terminal of the first device is disposed along the first edge of the first package;
the second package has first and second opposite edges that extend between the first and second sides;
the first package terminal of the second device is disposed along the first edge of the second package; and
the second edge of the first package is adjacent to the second edge of the second package.

35. The integrated-circuit module of claim 30 wherein the first and second integrated circuits each comprise a respective memory circuit.

36. The integrated-circuit module of claim 30 wherein:
the first integrated circuit is disposed on the second side of the first package;
the first package comprises:
  a first conductive pad disposed on the second side of the first package and coupled to the first circuit input terminal of the first integrated circuit;
  a first conductive path coupled to the first package terminal of the first device and to the first conductive pad;
  a second conductive pad disposed on the second side of the first package and coupled to the first circuit output terminal of the first integrated circuit; and
  a second conductive path coupled to the second package terminal of the first device and to the second conductive pad; and
the second integrated circuit is disposed on the second side of the second package; and
the second package comprises:
  a first conductive pad disposed on the second side of the second package and coupled to the second circuit input terminal of the second integrated circuit;
  a first conductive path coupled to the first package terminal of the second device and to the first conductive pad;
  a second conductive pad disposed on the second side of the second package and coupled to the second circuit output terminal of the second integrated circuit; and
  a second conductive path coupled to the second package terminal of the second device and to the second conductive pad.

37. The integrated-circuit module of claim 30 wherein:
the first integrated circuit is disposed on the second side of the first package;
the first package comprises:
  a first conductive pad disposed on the second side of the first package and coupled to the first circuit input terminal of the first integrated circuit;
  a first conductive path coupled to the first package terminal of the first device and to the first conductive pad;
  a second conductive pad disposed on the second side of the first package and coupled to the first circuit output terminal of the first integrated circuit; and
  a second conductive path coupled to the second package terminal of the first device and to the second conductive pad;
the second integrated circuit is disposed on the first side of the second package; and
the second package comprises:
  a first conductive pad disposed on the first side of the second package and coupled to the second circuit input terminal of the second integrated circuit;
  a first conductive path coupled to the first package terminal of the second device and to the first conductive pad;
  a second conductive pad disposed on the first side of the second package and coupled to the second circuit output terminal of the second integrated circuit; and
  a second conductive path coupled to the second package terminal of the second device and to the second conductive pad.

38. The integrated-circuit module of claim 30 wherein:
the signal has a value; and
the first integrated circuit is operable to configure the first circuit input and output terminals in response to the value of the signal.

39. The integrated-circuit module of claim 30 wherein:
the signal has a value; and
the second integrated circuit is operable to configure the second circuit input and output terminals in response to the value of the signal.

40. An integrated-circuit module, comprising:
a first integrated device including:
  a first package having first and second opposite sides;
  a first package terminal disposed on the first side;
  a second package terminal disposed on the second side and aligned with the first package terminal; and
  a first integrated circuit mounted to the first package and having a first circuit input terminal electrically coupled to the first package terminal, a first circuit output terminal electrically coupled to the second package terminal, and a conductive path electrically coupled between the first circuit input and output terminals;
a coupler having a first coupler terminal electrically coupled to the second package terminal, a second coupler terminal, and a conductive path electrically coupled to the first and second coupler terminals; and
a second integrated device disposed adjacent to the first packaged device and including:
  a second package having first and second opposite sides;
  a first package terminal disposed on the first side of the second package and electrically coupled to the second coupler terminal;
  a second package terminal disposed on the second side of the second package and aligned with the first package terminal of the second device; and
  a second integrated circuit mounted to the second package and having a second circuit input terminal electrically coupled to the first package terminal of the second device, a second circuit output terminal electrically coupled to the second package terminal of the second device, and a conductive path electrically coupled between the second circuit input and output terminals.

41. An electronic system, comprising:
a circuit board having an input pad and an output pad; and
an integrated device disposed on the circuit board and including:
  a package having first and second sides;
  a first package terminal disposed on the first side of the package and electrically coupled to the input pad;
  a second package terminal disposed on the second side of the package in alignment with the first package terminal, the second package terminal electrically coupled to the output pad; and
  an integrated circuit mounted to the package and having a first circuit terminal electrically coupled to the first package terminal, a second circuit terminal electrically coupled to the second package terminal, and a conductive path coupled to the first and second circuit terminals to form a signal path from the input pad, through the first package terminal, the first circuit terminal, the integrated circuit, the second circuit terminal, and the second package terminal, to the output pad.

42. The electronic system of claim 41, further comprising:
a supply terminal; and
a termination circuit having a first terminal electrically coupled to the output pad and having a second terminal electrically coupled to the supply terminal.

43. The electronic system of claim 41, further comprising:
a supply terminal; and
a termination impedance having a first terminal electrically coupled to the output pad and having a second terminal electrically coupled to the supply terminal.

44. An electronic system, comprising:
a circuit board having an input pad and an output pad; and
an integrated-circuit module disposed on the circuit board and including:
  a first integrated device disposed on the circuit board and including:
    a first package having first and second sides;
    a first package terminal disposed on the first side and electrically coupled to the input pad;
    a second package terminal disposed on the second side and aligned with the first package terminal; and
    a first integrated circuit mounted to the first package and having a first circuit input terminal electrically coupled to the first package terminal, a first circuit output terminal electrically coupled to the second package terminal, and a first conductive path electrically coupled to the first circuit input and output terminals to form a serial signal path from the input pad, through the first package terminal, the first circuit input terminal, the integrated circuit, and the first circuit output terminal, to the second package terminal; and
  a second integrated device including:
    a second package having first and second sides;
    a first package terminal disposed on the first side of the second package and electrically coupled to the second package terminal of the first device;
    a second package terminal disposed on the second side of the second package and aligned with the first package terminal of the second device, the second package terminal electrically coupled to the output pad; and
    a second integrated circuit mounted to the second package and having a second circuit input terminal electrically coupled to the first package terminal of the second device, a second circuit output terminal electrically coupled to the second package terminal of the second device, and a second conductive path electrically coupled to the second circuit input and output terminals to form a serial signal path from the second package terminal of the first device, through the first package terminal of the second device, the second circuit input terminal, the second integrated circuit, the second circuit output terminal, and the second package terminal of the second device, to the output pad.

45. The electronic system of claim 44, further comprising:
a supply terminal; and
a termination circuit having a first terminal coupled to the output pad and having a second terminal coupled to the supply terminal.

46. The electronic system of claim 44 wherein the integrated-circuit module comprises a termination circuit that is coupled between the second package terminal of the first device and the first package terminal of the second device.

47. An electronic system, comprising:
a circuit board having an input pad and an output pad; and
an integrated-circuit module disposed on the circuit board and including:
  a first integrated device including:
    a first package having first and second opposite sides;
    a first package terminal disposed on the first side and electrically coupled to the input pad;
    a second package terminal disposed on the second side and aligned with the first package terminal; and
    a first integrated circuit mounted to the first package and having a first circuit input terminal electrically coupled to the first package terminal, a first circuit output terminal electrically coupled to the second package terminal, and a conductive path electrically coupled to the first circuit input and output terminals to form a serial signal path from the input pad, to the first package terminal, to the first circuit input terminal, through the integrated circuit to the first circuit output terminal, and to the second package terminal;
  a coupler having a first coupler terminal electrically coupled to the second package terminal, a second coupler terminal, and a conductive path electrically coupled to the first and second coupler terminals; and
  a second integrated device disposed adjacent to the first packaged device and including:
    a second package having first and second opposite sides;
    a first package terminal disposed on the first side of the second package and electrically coupled to the second coupler terminal;
    a second package terminal disposed on the second side of the second package and aligned with the first package terminal of the second device, the second package terminal electrically coupled to the output pad; and
    a second integrated circuit mounted to the second package and having a second circuit input terminal electrically coupled to the first package terminal of the second die, a second circuit output terminal electrically coupled to the second package terminal of the second die, and a conductive path electrically coupled to the second circuit input and output terminals to form a serial signal path from the second package terminal of the first device, through the coupler to the first package terminal of the second device, to the second circuit input terminal, through the second integrated circuit to the second circuit output terminal, to the second package terminal of the second device, and to the output pad.

48. The electronic system of claim 47, further comprising:

a supply terminal; and a termination circuit having a first terminal electrically coupled to the output pad and having a second terminal electrically coupled to the supply terminal.

49. The electronic system of claim 47 wherein the conductive path of the coupler comprises a termination circuit that is electrically coupled between the first and second coupler terminals.

50. A method, comprising:

electrically coupling a signal to a first terminal disposed on a first side of a device package;

electrically coupling the signal from the first terminal through an integrated circuit disposed on the package; and electrically coupling the signal from the integrated circuit to a second terminal disposed on a second side of the package in alignment with the first terminal.

51. The method of claim 50, further comprising:

electrically coupling the signal from the second terminal to a third terminal disposed on the second side of the package; and electrically coupling the signal from the third terminal to a fourth terminal disposed on the first side of the package.

52. The method of claim 50, further comprising terminating the signal after the second terminal.

53. A method, comprising:

electrically coupling a signal to a first terminal disposed on a first side of a first device package;

electrically coupling the signal from the first terminal, through a first integrated circuit mounted to the first package, and to a second terminal disposed on a second side of the first package in alignment with the first terminal;

electrically coupling the signal from the second terminal of the first package to a third terminal disposed on a first side of a second device package; and electrically coupling the signal from the third terminal, through a second integrated circuit mounted to the second package, and to a fourth terminal disposed on a second side of the second package in alignment with the third terminal.

54. The method of claim 53, further comprising:

electrically coupling the signal from the fourth terminal to a fifth terminal disposed on the second side of the first package; and electrically coupling the signal from the fifth terminal to a sixth terminal disposed on the first side of the first package.

55. The method of claim 53, further comprising:

electrically coupling the signal from the fourth terminal to a fifth terminal disposed on the first side of the second package;

electrically coupling the signal from the fifth terminal to a sixth terminal disposed on the second side of the first package; and electrically coupling the signal from the sixth terminal to a seventh terminal disposed on the first side of the first package.

56. The method of claim 53, further comprising:

electrically coupling the signal from the fourth terminal to a fifth terminal disposed on the second side of the second package;

electrically coupling the signal from the fifth terminal to a sixth terminal disposed on the first side of the second package;

electrically coupling the signal from the sixth terminal to a seventh terminal disposed on the second side of the first package; and electrically coupling the signal from the seventh terminal to an eighth terminal disposed on the first side of the first package.

57. The method of claim 53, further comprising terminating the signal after the fourth terminal.

* * * * *